United States Patent
Pons et al.

(10) Patent No.: US 7,555,052 B2
(45) Date of Patent: Jun. 30, 2009

(54) METHOD AND SYSTEM FOR A TURBO TRELLIS CODED MODULATION SCHEME FOR COMMUNICATION SYSTEMS

(75) Inventors: Julien Pons, Eatontown, NJ (US); Patrick Duvaut, Tinton Falls, NJ (US)

(73) Assignee: Conexant Systems, Inc., Red Bank, NJ (US)

(*) Notice: Subject to any disclaimer, the term of this patent is extended or adjusted under 35 U.S.C. 154(b) by 638 days.

(21) Appl. No.: 11/248,224

(22) Filed: Oct. 13, 2005

(65) Prior Publication Data

US 2006/0078062 A1    Apr. 13, 2006

Related U.S. Application Data

(60) Provisional application No. 60/617,680, filed on Oct. 13, 2004.

(51) Int. Cl.
H04L 5/12 (2006.01)
(52) U.S. Cl. .................. 375/265; 375/261; 714/792
(58) Field of Classification Search .......... 375/265, 375/295, 298, 261; 714/755, 792
See application file for complete search history.

(56) References Cited

U.S. PATENT DOCUMENTS

| | | | | |
|---|---|---|---|---|
| 6,000,054 A * | 12/1999 | Bahr et al. | | 714/786 |
| 6,088,387 A * | 7/2000 | Gelblum et al. | | 375/222 |
| 6,693,973 B2 * | 2/2004 | Ionescu | | 375/295 |
| 7,173,978 B2 * | 2/2007 | Zhang et al. | | 375/298 |
| 2002/0051501 A1 * | 5/2002 | Demjanenko et al. | | 375/298 |
| 2002/0087923 A1 * | 7/2002 | Eroz et al. | | 714/702 |
| 2002/0101915 A1 * | 8/2002 | Zhang et al. | | 375/222 |
| 2002/0150167 A1 * | 10/2002 | Demjanenko et al. | | 375/259 |

* cited by examiner

*Primary Examiner*—Temesghen Ghebretinsae
(74) *Attorney, Agent, or Firm*—Thomas, Kayden, Horstemeyer & Risley, LLP

(57) ABSTRACT

Method and System for evaluating a turbo-coding scheme suitable for VDSL2 systems. The scheme is a Turbo-Trellis Coded Modulation TTCM that makes use of a Parallel Concatenated Convolutional Code (PCCC) including an inner Latin square/rectangular matrix of Random sequence pattern Interleaver (LRI) of approximately 2044 bits. In the presence of the outer Reed Solomon Code but without an outer interleaver (fast mode), the method and system provides 7.1 dB of average net coding gain, i.e., 2.6 dB of coding gain improvement relative to the standard 16 states 4-dimensional (4-D) trellis code used in current ADSL2 systems. The substantial coding gain achieved through the method and system, leads to an increase in the VDSL2 rate by 38% at 6 kft against local exchange carriers, such as ILEC (SBC) conditions with approximately 1.5 ms of latency. By encoding only two bits per tone (i.e., 1 bit per dimension), the turbo code implementation complexity is kept reasonable. Finally, the coded modulation scheme supports very small constellations, allowing transmitting spectral efficiency as low as 0.5 bit/sec/Hz over Binary Phase Shift Keying (BPSK) constellations at a signal-to-noise-ration (SNR) very close to the Shannon bound.

29 Claims, 19 Drawing Sheets

Rate $R=m/(m+2)$ generic TTCM scheme (for $m \geq 2$)

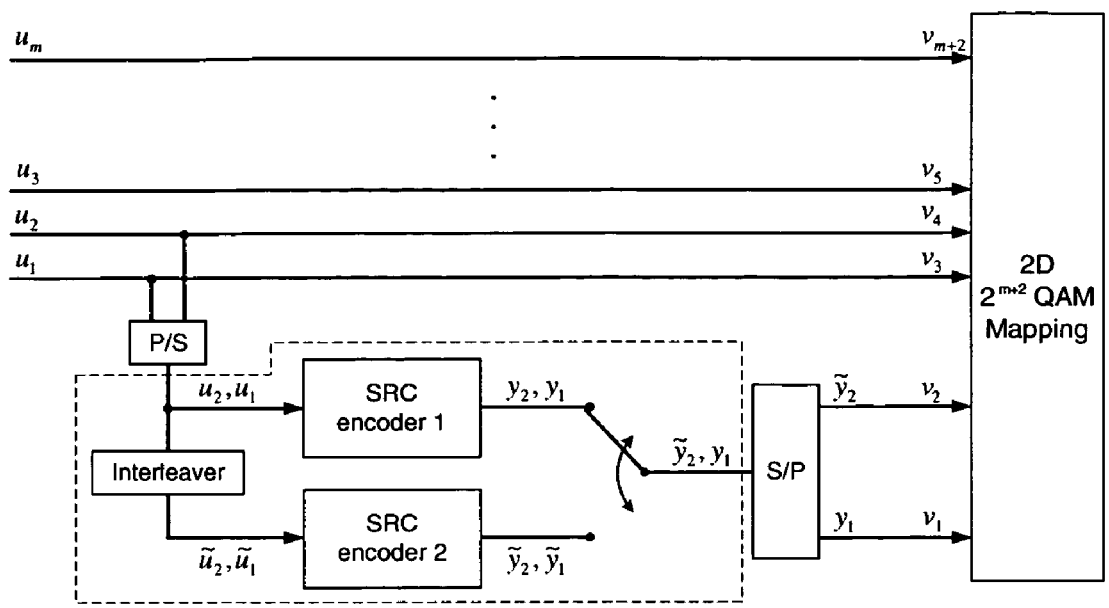
Figure 1: Rate $R=m/(m+2)$ generic TTCM scheme (for $m \geq 2$)

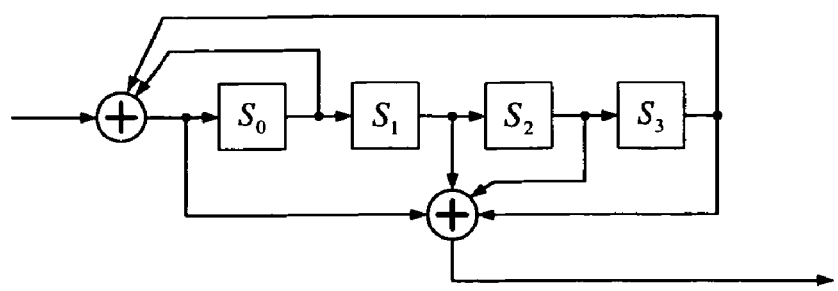
Figure 2: 16 states machine of the $(31,27)_8$ SRC encoder

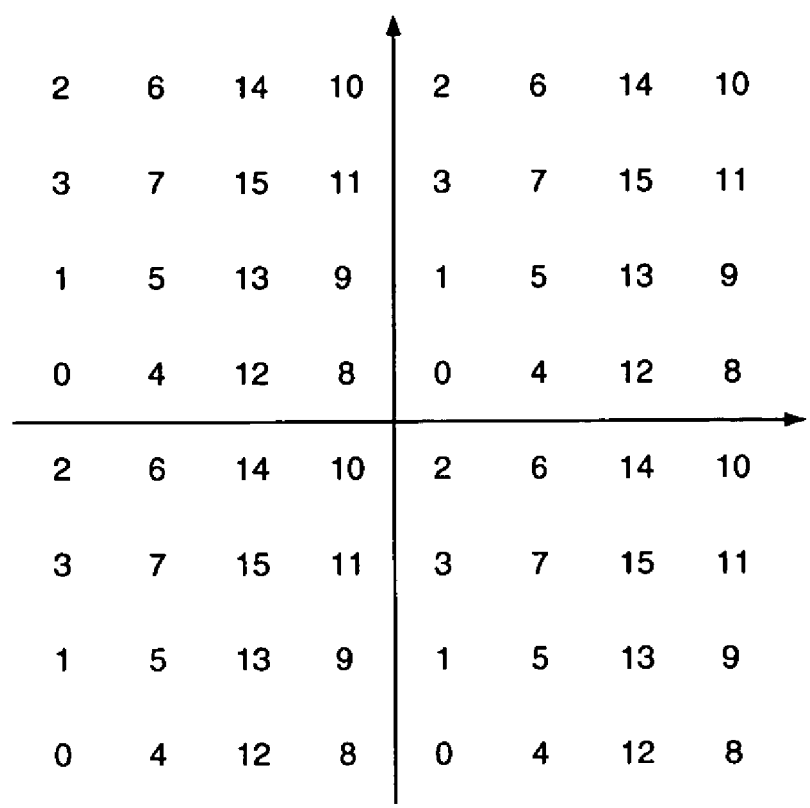
Figure 3: Coset partitioning

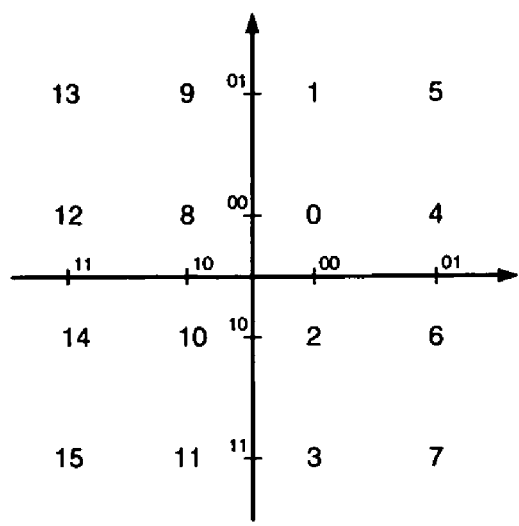
Figure 4: 16-QAM constellation ($b=4$)

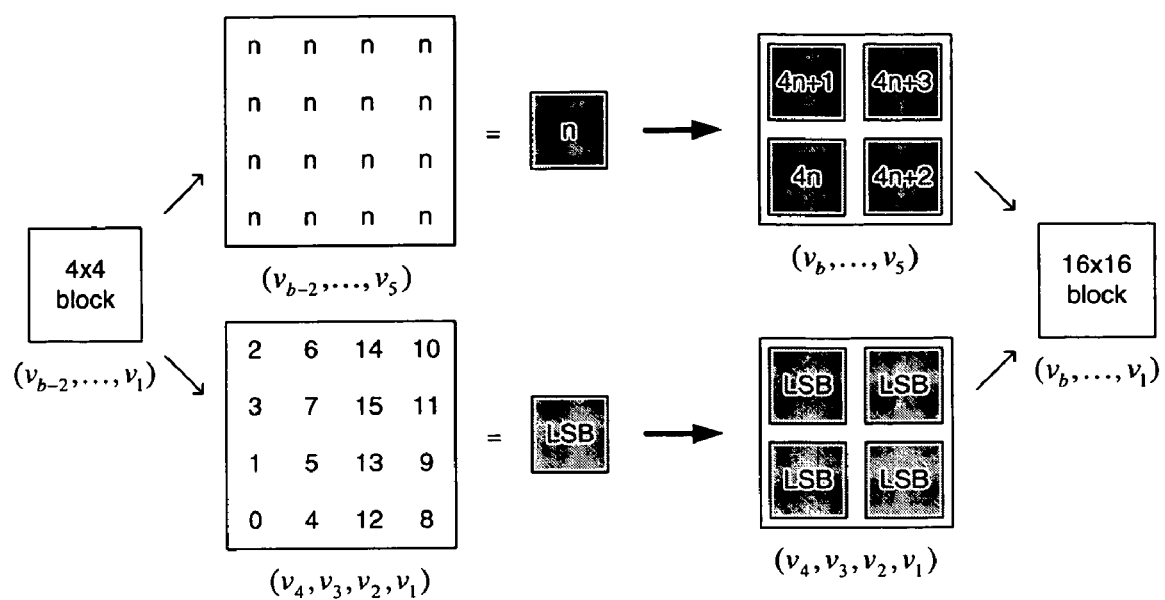
Figure 5: Expansion of a 4×4 block labeling into a 16×16 block labeling

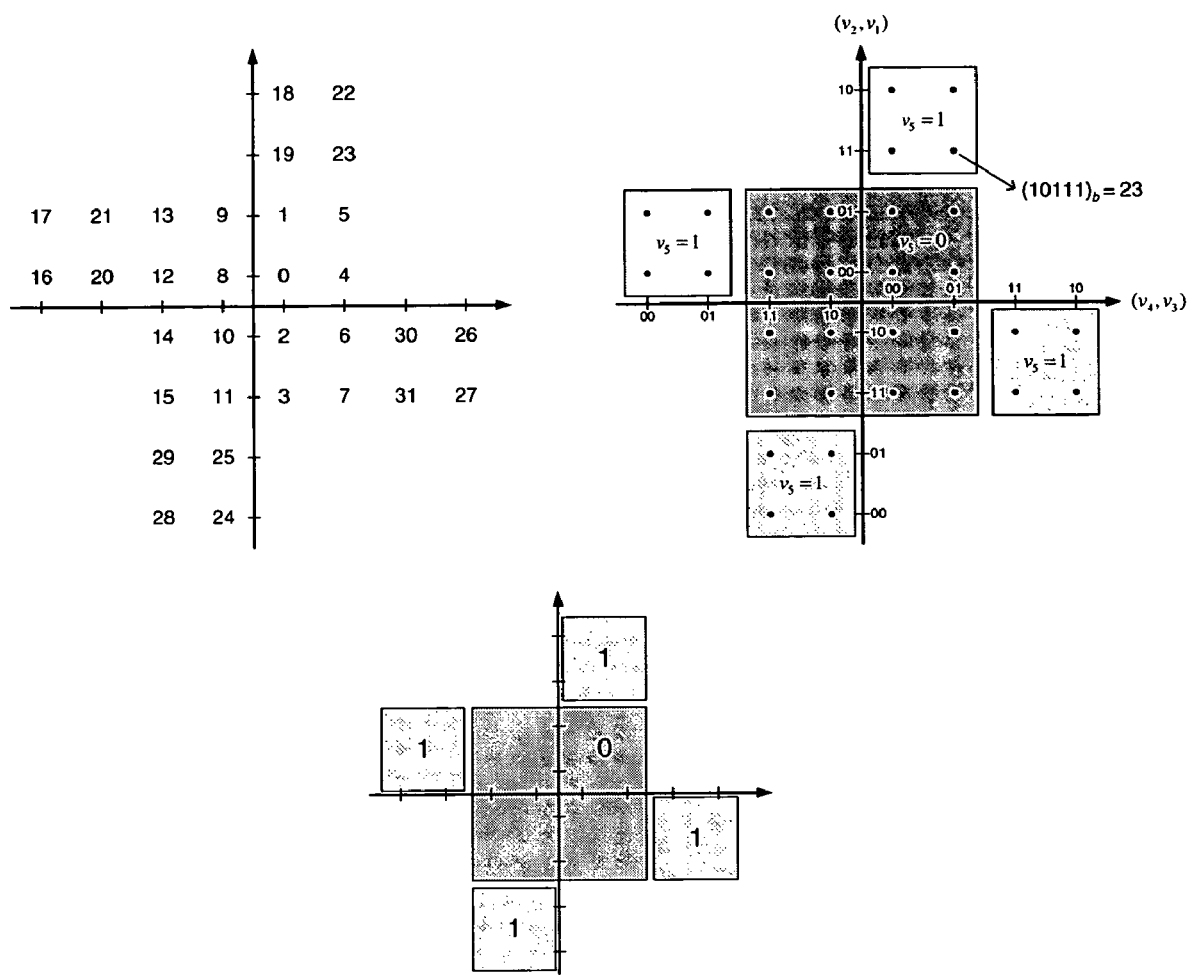
Figure 6: Constellation mapping for $b=5$

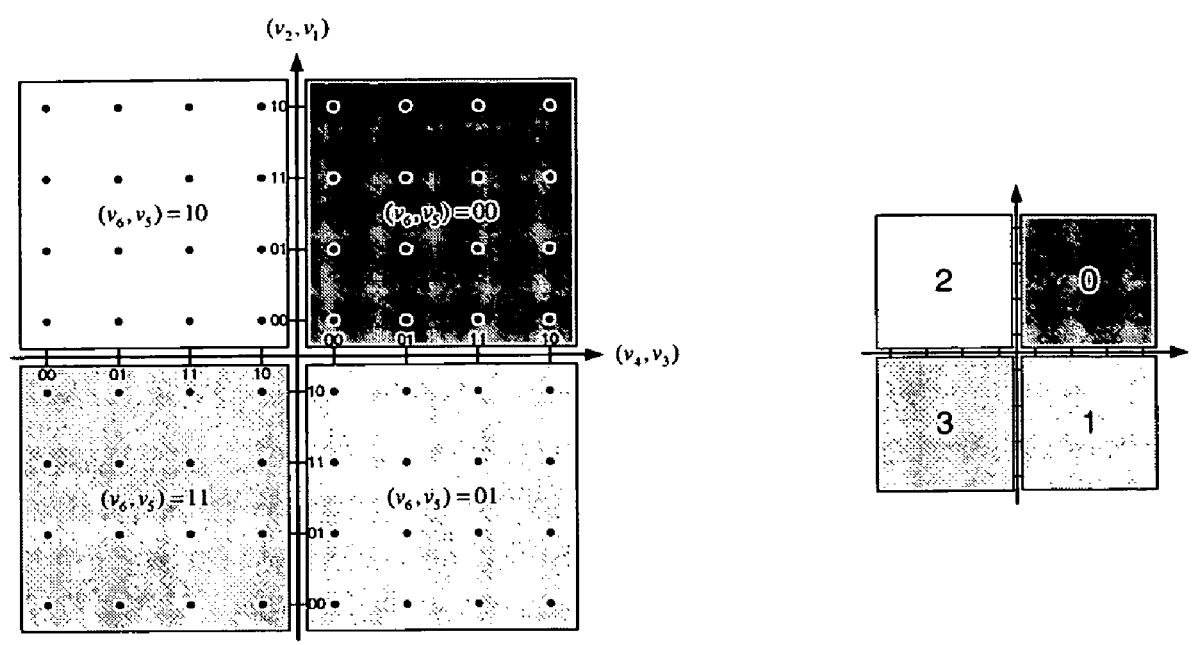
Figure 7: Constellation mapping for $b=6$

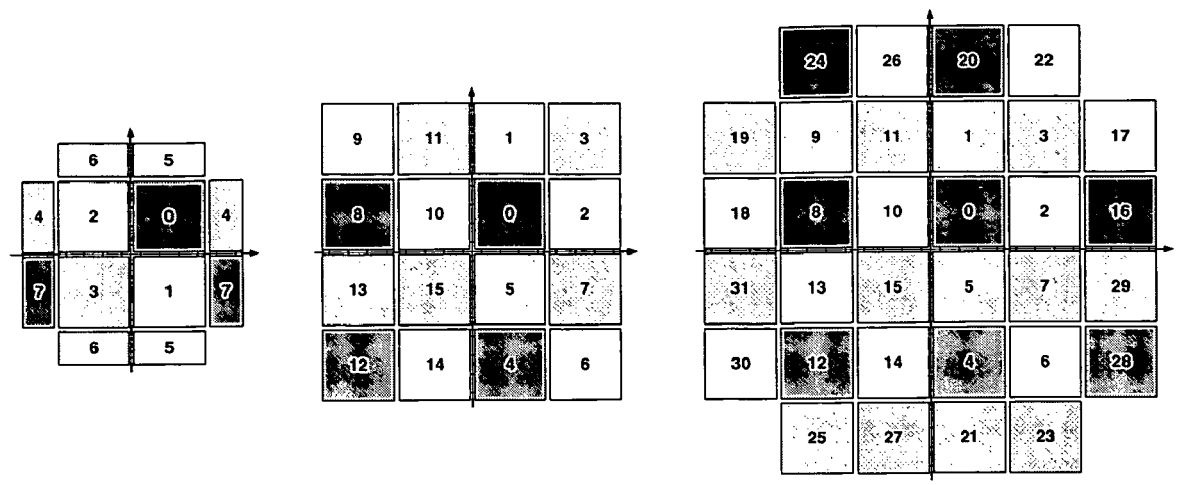
Figure 8: Constellation mapping for $b=7$, 8 and 9

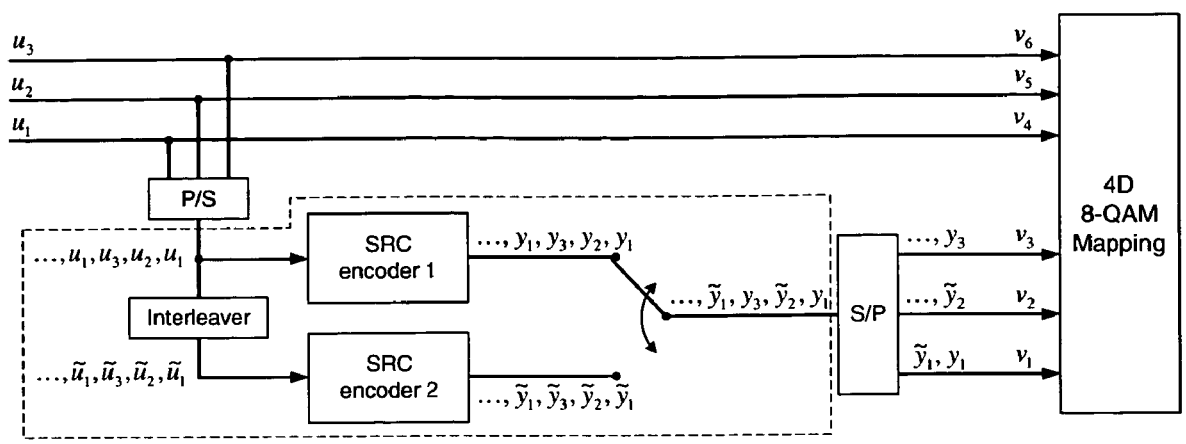
Figure 9: Rate-1/2 turbo trellis code for $m = 1.5$

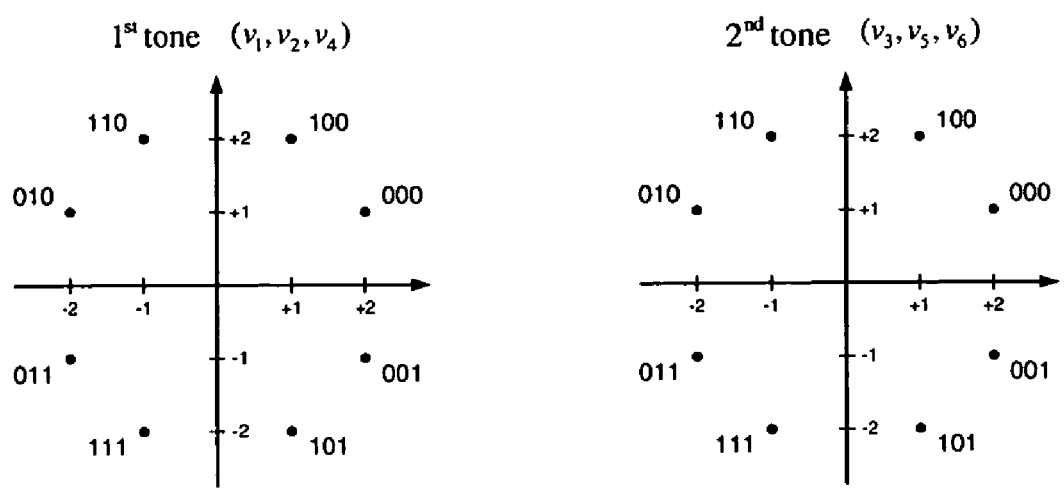
Figure 10: 4-D 8-QAM constellation mapping and labeling ($b=3$)

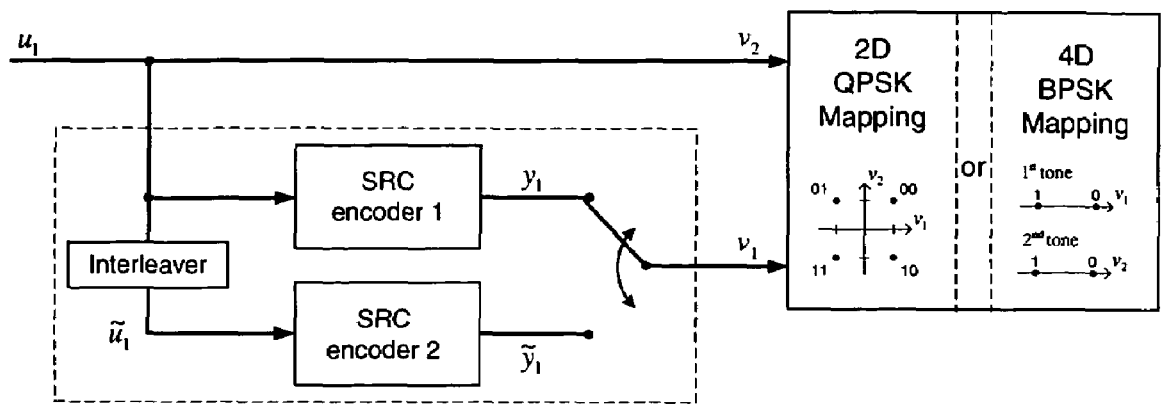
Figure 11: Rate-1/2 turbo trellis code for $m=0.5$ and 1

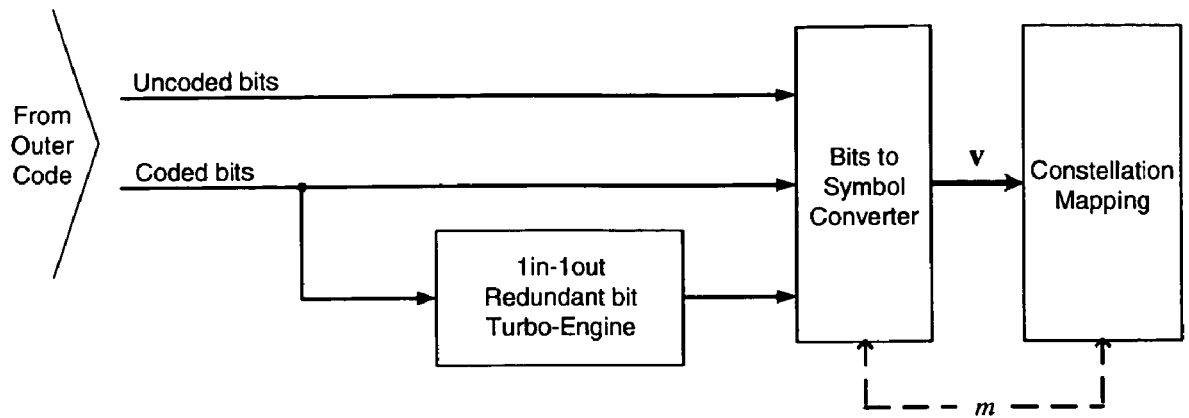
Figure 12: TTCM scheme for all $m$

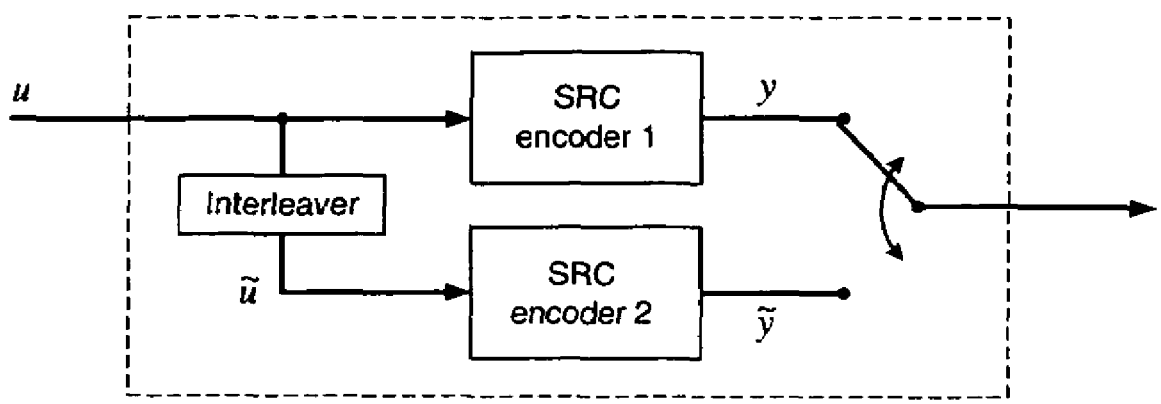
Figure 13: 1in-1out Redundant bit Turbo-Engine

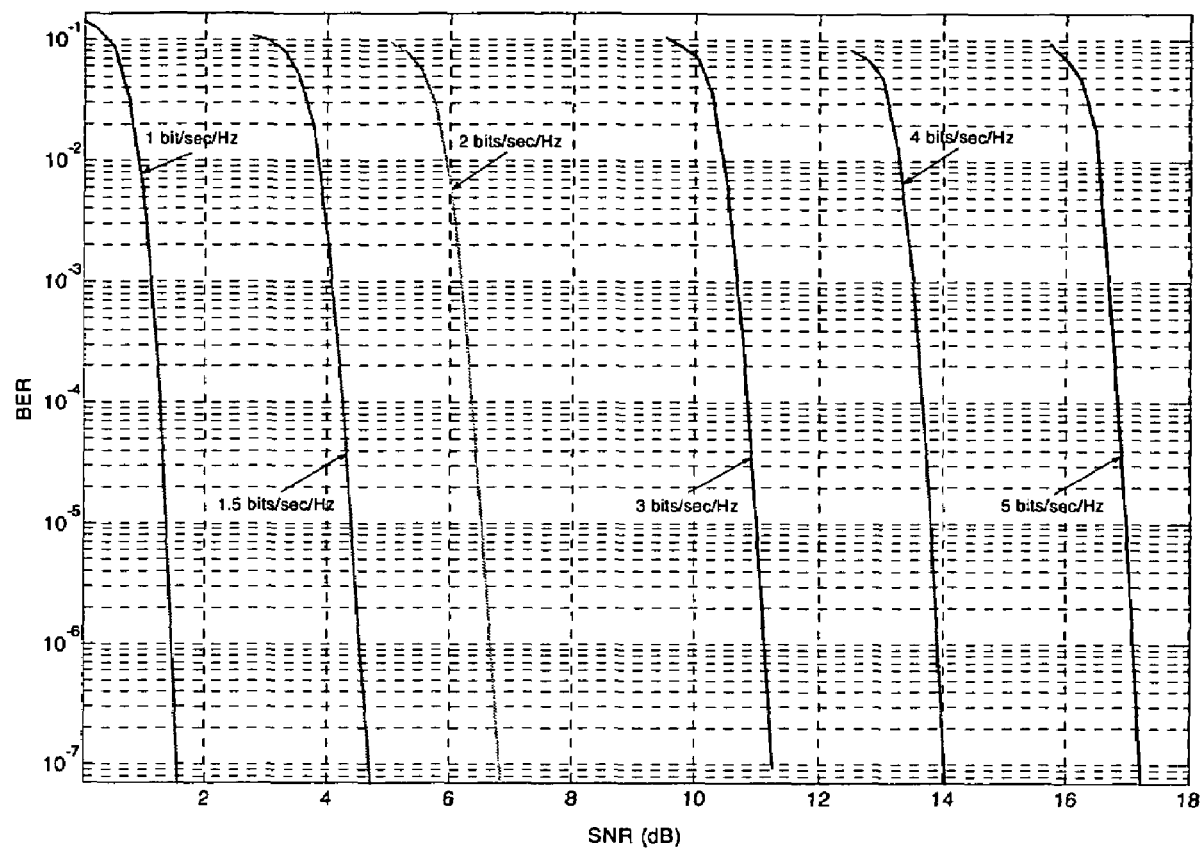
Figure 14: TTCM+RS error performance for $m = 1$ to 5 bits/sec/Hz

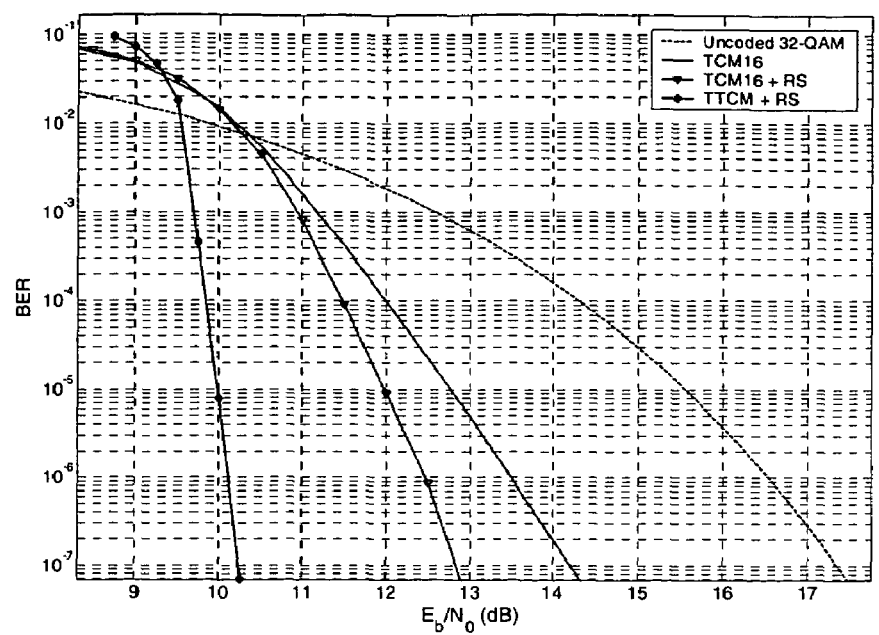
Figure 15: TCM and TTCM performance curves for 5 bits/sec/Hz spectral efficiency

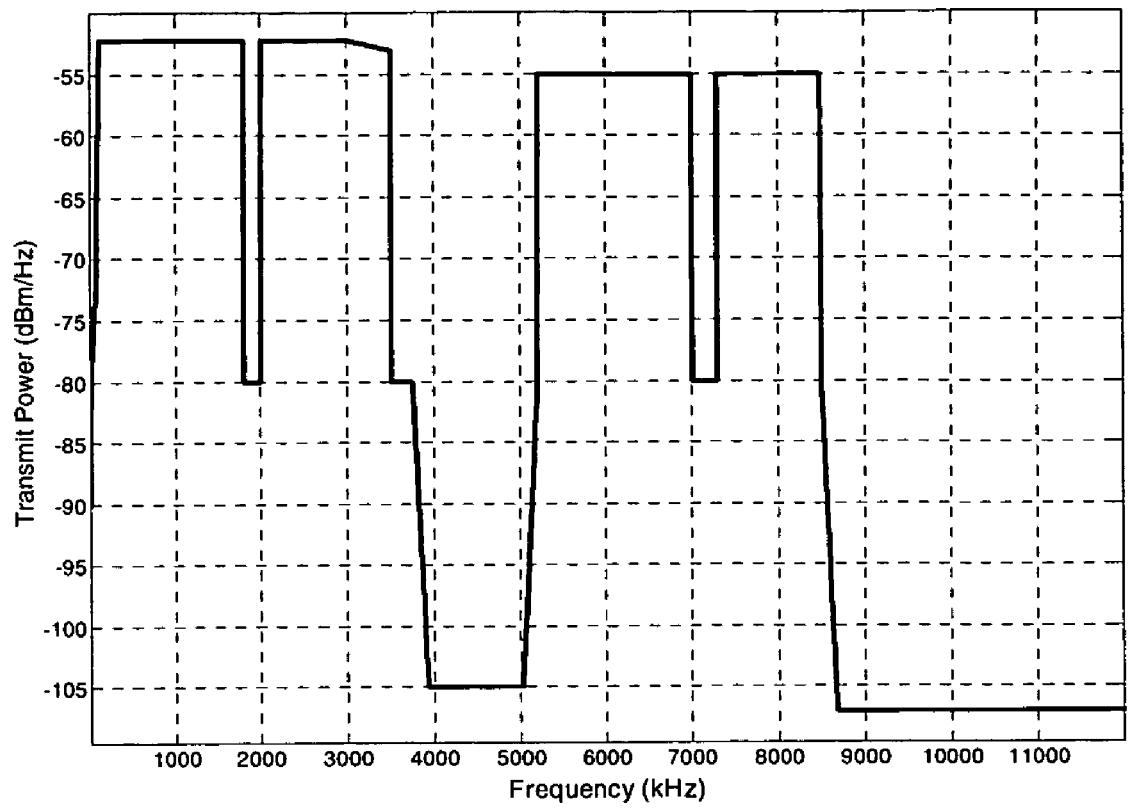
Figure 16: Ceiling mask for VDSL downstream

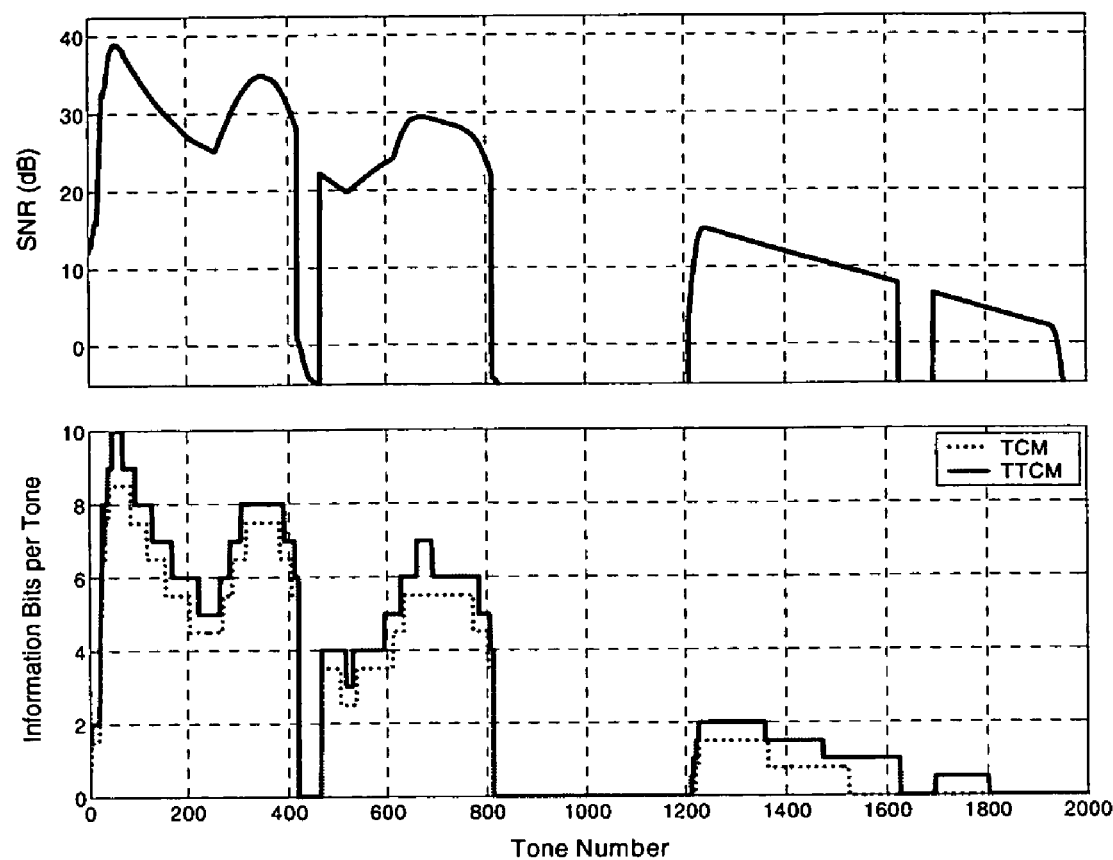
Figure 17: SNR and bit loading of a 3 kft loop under SBC conditions

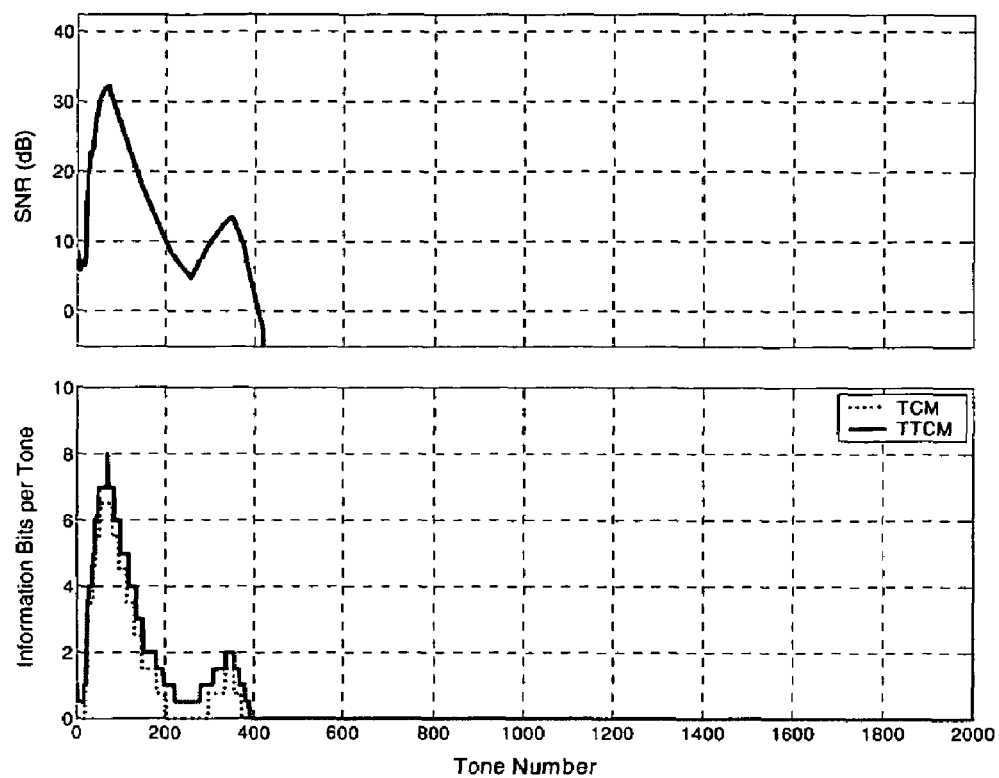
Figure 18: SNR and bit loading of a 6 kft loop under SBC conditions

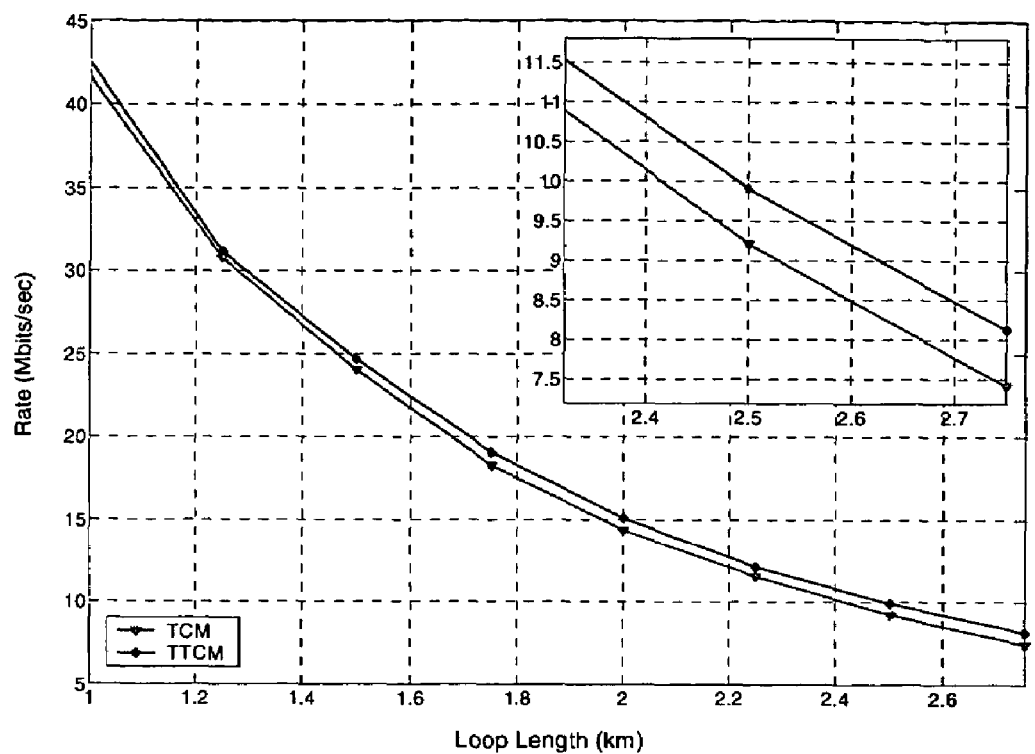
Figure 19: Rate vs. reach performance over AWGN channel

METHOD AND SYSTEM FOR A TURBO TRELLIS CODED MODULATION SCHEME FOR COMMUNICATION SYSTEMS

CROSS REFERENCE TO RELATED APPLICATIONS

This application claims priority to U.S. provisional patent application 60/617,680, filed Oct. 13, 2004 entitled "Turbo Trellis Coded Modulation for VDSL2."

FIELD OF THE INVENTION

The invention relates general to Discrete multi-tone (DMT) data communication systems, and more specifically to systems and methods for implementing a Turbo Trellis Coded Modulation scheme such as for use in VDSL2 and DMT systems.

BACKGROUND OF THE INVENTION

The explosive growth of the Internet has created a demand for high data rates for business and residential users (SOHO—small office/house office). Because of the prevalence of twisted pair copper wires in existing telephone networks, much of the demand must be met by data communication protocols that are adapted to transmit data over these standard analog plain old telephone systems (POTS) lines. The need for high-speed access to the home and businesses appears to be ever increasing due in part to the availability of information, data, high-bandwidth video and the like from the world wide web. Because of this ever increasing demand, higher speed modems are required.

Originally data transmission over POTS lines was accomplished using voice/data modems. These devices modulate data just like voice signals. As a results their theoretical data transfer speed limit is insufficient to deliver broadband content. Current voice/data modems appear to have reached a maximum data transfer speed of up to 56.6K bits/second.

Due to the inadequacy of voice/data modems, the industry looked for new solutions to delivering high speed data access over existing twisted pair copper telephone lines. One result of these efforts was the emergence of digital subscriber line technology (DSL). DSL provides high speed data transmission over relative short distances of twisted pair lines by utilizing the portion of the available bandwidth in the twisted pair above the few thousand kilohertz utilized by voice communications. Because of bandwidth limitation (4 KHz), and power limitation of the telephone network, line coding schemes are used to encode digital signals into analog signals that convey the analog information over the analog telephone network. The line coding schemes manipulate the analog carrier signal, which has three attributes, amplitude, phase and frequency. One or more of such attributes may be manipulated by known modulation techniques such as, for example, quadrature amplitude modulation (QAM) whereby the carrier signal's phase and amplitude is modulated to encode more data within a frequency bandwidth. One example of a QAM modulation system sends two bits of information per QAM symbol, where the digital values can be encoded and the corresponding amplitude and phase can be represented using a constellation. Increasing the constellation size, that is number of points (bits), will cause the bit density per symbol to increase, and hence achieve higher data rates.

An upper limit on this process of constellation mapping stems from the fact that as the constellation size increases, the granularity of the phase and the amplitude difference between different constellation points diminishes, making it increasingly difficult to decode the constellation points, especially in the presence of noise. One way of circumventing this problem is to increase the Euclidean distance between symbols by employing trellis coding. Trellis coding is particularly well suited for this because it is bandwidth efficient, since the symbol rate and required bandwidth is not increased. As noted above, as the constellation size gets bigger, the problem of detecting a constellation increases due to the greater symbol density increases. Therefore, a way of counter-acting the effects the short Euclidean distance between symbols is to partition the quadrature amplitude modulated signal into subsets, thereby creating an acceptable Euclidean distance between symbols.

In a typical DSL system, data from a personal computer or other equipment at the customer premise (CPE) is sent to a transmitter which arranges the data into frame packets; the packetized signal is then quadrature amplitude modulation encoded and error encoded using trellis encoding to improve the noise immunity using a convolutional coder to select a sequence of subsets in a partitioned signal constellation. A numerical symbol vector is trellis encoded. The trellis encoding starts with the most significant symbol and ends with the least significant symbol of the vector, a process which employs convolutional encoding that converts the input symbol to another symbol and then maps the encoded symbol to its corresponding 16 QAM signal constellation point.

Trellis-coded modulation (TCM) is a well-established technique in digital communications. A turbo code combines binary component codes (which typically include trellis codes) with interleaving. A turbo code is primarily composed of parallel concatenated convolutional codes (PCCCs) implemented by two or more constituent systematic encoders joined through one or more interleavers. The input information bits are fed through a first encoder and, after having been scrambled by the interleaver, enter a second encoder. A code word of a parallel concatenated code consists of the input bits to the first encoder followed by a parity check bits of both encoders. The suboptimal iterative decoding structure for such a code is modular, and consists of a set of concatenated decoding modules—one for each constituent code—connected through an interleaver identical to the one in the encoder side. Each decoder performs weighted soft decoding of the input sequence. PCCCs yield very large coding gains at the cost of a reduction in the data rate and/or an increase in bandwidth. Convergence analysis of iterative decoding algorithms for turbo codes has received much attention recently due to its usefulness in predicting code performance, and its ability to provide insights into the encoder structure and help with the code design. Turbo trellis coded modulation (TTCM), conjoins Ungerboeck's signal space partition with turbo coding to achieve significant coding gains without increasing bandwidth. The performance of TTCM schemes depends on the Euclidean distances between sequences of symbols rather than the Hamming distance of the underlying binary codes, the structure of TTCM schemes is more complex and difficult to analyze. Hence the convergence analysis is even more important for TTCM in order to facilitate the design and comparison between schemes.

Because the Euclidean distance between symbols points is a paramount feature of the QAM signal, and since the discrete multi-tone modulation scheme employed by some of the high data rate systems such as DSL requires transmitting of at least three DMT symbols per tone, there is a need to use more efficient Trellis codes in DMT.

SUMMARY OF THE INVENTION

In view of the need to employ more efficient Trellis codes in DMT, various embodiments of the invention may provide an improved turbo trellis coded modulation that makes use of a parallel concatenated convolutional code including an inner LRI interleaver.

Various embodiments of the invention may provide a method and apparatus for encoding data bits in DMT modulation system utilizing a Turbo Trellis encoder in order to achieve further improvement in the achievable coding gain by employing coset partitioning, bit conversion, and constellation encoding that fit the DMT modulation.

At least one embodiment of the invention may provide a method of performing turbo trellis coded modulation (TTCM) on an n bit information word in a DMT system. The method of performing turbo trellis coded modulation (TTCM) on an n bit information word in a DMT system according to this embodiment may comprise passing at least one least significant bit of the n bit information word into a redundant bit turbo-engine to generate an m bit code word, wherein passing the one or more information bits into the redundant bit turbo-engine comprises splitting the at least one least significant bit into duplicate first and second serial data streams, passing the first serial data stream through a first systematic recursive encoder and passing the second serial data stream through a second systematic recursive encoder preceded by an interleaver, alternatively selecting bits output from the first and second systematic recursive encoders to form an m-bit serial data stream, converting the m-bit serial data stream into the m-bit code word through serial to parallel conversion, appending the m-bit code word to the n bit information word at the least significant bit position to create an (n+m) bit codeword v, and preparing the codeword v for transmission over a communications channel.

At least one additional embodiment of the invention may provide a redundant bit turbo engine apparatus for performing turbo trellis coded modulation (TTCM) on an n bit information word in a DMT system. The redundant bit turbo engine apparatus for performing turbo trellis coded modulation (TTCM) on an n bit information word in a DMT system according to this embodiment may comprise first and second serial data paths that each receive a duplicate serial data stream comprised of at least one least significant bit of the n bit information word, wherein the first serial data path comprises a first systematic recursive encoder, and the second serial data path comprises a second systematic recursive encoder preceded by an interleaver, and a switch adapted to alternatively select bits output from the first and second serial data paths to form an m-bit serial data stream

BRIEF DESCRIPTION OF THE DRAWINGS

The present invention can be understood more completely by reading the following Detailed Description of the Preferred Embodiments, in conjunction with the accompanying drawings figures.

FIG. 1 is a rate generic Turbo Trellis Coded Modulation scheme according to at least one embodiment of the invention;

FIG. 2 is a 16 state machine systemic recursive convolutional encoder according to at least one of the embodiment of the invention;

FIG. 3 is a 2-D signal partitioned into 16 cosets according to at least one embodiment of the invention;

FIG. 4 is a 16 quadrature amplitude modulation with b=4 according to at least one embodiment of the invention;

FIG. 5 is an expansion of 4*4 labeling into a 16*16 block labeling according to at least one embodiment of the invention;

FIG. 6 is a constellation mapping for b=5 according to at least one embodiment of the invention;

FIG. 7 is a constellation mapping for b=6 according to at least one embodiment of the invention;

FIG. 8 is a constellation mapping for b=7, 8 and 9 according to at least one embodiment of the invention;

FIG. 9 is a Turbo Trellis encoder with a half rate turbo trellis code for m=1.5 according to at least one embodiment of the invention;

FIG. 10 is a 4-D 8 quadrature amplitude modulation constellation mapping and labeling with b=3 according to at least one embodiment of the invention;

FIG. 11 is a Turbo Trellis encoder with a half rate turbo trellis code for m=0.5 and 1 according to at least on embodiment of the invention;

FIG. 12 is a Turbo Trellis Coded Modulation scheme for all m according to at least one embodiment of the invention;

FIG. 13 is a one-in, one-out redundant turbo engine according to at least one embodiment of the invention;

FIG. 14 is a bit error rate versus signal-to-noise ratio curves for Turbo Trellis Coded Modulation plus a Reed Solomon scheme for BER performance for m=1, 1.5, 2, 3, 4 and 5 bits/second/Hz according to at least one embodiment of the invention;

FIG. 15 is a comparison between TTCM+RS versus TCM+RS schemes for 5 bits/sec/Hz spectral efficiency according to at least one embodiment of the invention;

FIG. 16 is a graph of frequency versus transmit power for downstream transmission using the ceiling mask with a total power of 14.5 dBm according to at least one embodiment of the invention;

FIG. 17 is a pair of graphs illustrating SNR and bit loading across the tone spectrum of a 3K foot loop under SBC conditions according to at least one embodiment of the invention;

FIG. 18 is a pair of graphs illustrating SNR and bit loading across the tone spectrum of a 6K foot loop under SBC conditions according to at least one embodiment of the invention; and FIG. 19 is graph of data rate versus loop length over an AWGN channel according to at least one embodiment of the invention.

DETAILED DESCRIPTION

The following description is intended to convey a thorough understanding of the invention by providing a number of specific embodiments and details involving the Trellis code in the DMT physical layer for further performance enhancement techniques. Various improvements and modifications to the preferred embodiments will become apparent to those skilled in the art, and the general principles defined herein may be applied to other embodiments. Therefore, the present invention is not limited to the specific embodiments shown and described, but interpreted to a larger scope consistent with the novel features disclosed herein.

Table 1.1 below is a list of acronyms used in the disclosure:

TABLE 1.1

Acronyms Used

| | |
|---|---|
| ADSL | Asymmetric Digital Subscriber Line |
| ASK | Amplitude Shift Keying |
| AWGN | Additive White Gaussian Noise |
| TTCM | Turbo Trellis Coded Modulation |
| LRI | Latin square/rectangular matrix of Random sequence pattern Interleaver |
| PCCC | Parallel Concatenated Convolutional Codes |
| QAM | Quadrature Amplitude Modulation |
| LSB | Least Significant Bit |
| MSB | Most Significant Bit |
| SNR | Signal to Noise Ratio |
| S/P | Serial-to-Parallel |
| SRC | Systematic Recursive Convolutional |
| MSED | Minimum Square Euclidean Distance |
| BPSK | Binary Phase Shift Keying |
| QPSK | Quadrature Phase Shift Keying |
| BER | Bit Error Rate |
| VDSL | Very High (date rate) Digital Subscriber Line |

As discussed above, in at least one embodiment of the present invention, a Turbo Trellis coding modulation scheme with a variable-rate multilevel code encoding m information bits per tone is provided, where m is also defined as the spectral efficiency (in bits/sec/Hz) of the code. The TTCM scheme according to this embodiment is designed to transmit b-bits QAM signals, where b is an integer varying from 1 to 15 (or more). Consequently, the scheme must support all integer values of m up to 13 (or more), as well as the two specific spectral efficiencies m=0.5 and 1.5. Although using the same core turbo code, which is a binary PCCC, 4 slightly different schemes were designed in respect to the spectral efficiency. The coding scheme has been optimized for each particular case: m=0.5, m=1, m=1.5 and m≧2. For the sake of simplicity, the description of the overall code is divided in two steps. The generic multilevel scheme, defined for m larger than 2. The remaining values m=0.5, 1 and 1.5 correspond to 3 particular schemes, that have been optimized separately Referring now to FIG. 1, a generic TTCM scheme with m≧2 bits/second/Hz. For m larger than 2, the generic TTCM scheme is a rate R=m(m+2) multilevel code encoding an m-bits information word u into an (m+2)-bits codeword v is illustrated. As shown in FIG. 1, the two least significant bits (LSB) ($u_1$, $u_2$) of u are encoded by a rate-2/4 turbo encoder into the 4 LSBs ($v_1$, $v_2$, $v_3$, $v_4$) of v. The (m−2) remaining bits are not coded ($v_{i+2}=u_i$, for 2<i<m). Each codeword v is mapped on a 2-D $2^{m+2}$-points QAM constellation.

According to another embodiment of the present invention, and in reference to FIG. 2, there is shown a 16-state machine of an systematic recursive convolutional encoder (SRC). The rate-2/4 turbo code is systematic, hence $v_3=u_1$ and $v_4=u_2$. In various embodiments, the two bits $v_1$ and $v_2$ are obtained by encoding alternatively the two bits $u_1$ and $u_2$ with a rate-1/2 binary PCCC formed by the parallel concatenation of two identical rate-1/2 binary Systematic Recursive Convolutional (SRC) encoders separated by an interleaver. In various embodiments, the generator matrix of each component encoder may be represented by [1, g(D)], where g(D)=n(D)/d(D) is the generator polynomial of a 16 states convolutional machine (see FIG. 2). In various embodiments the code may be optimized for a lowest bit error probability at high SNR, therefore the polynomials $n(D)=1+D^2+D^3+D^4=(27)_8$ and $d(D)=1+D+D^4=(31)_8$ are chosen. The bits $u_1$ and $u_2$ are serialized into a stream ($u_1$, $u_2$) and fed to the first SRC encoder.

The second encoder operates on the interleaved stream ($\tilde{u}_1$, $\tilde{u}_2$). The output of each SRC encoder encoding respectively ($u_1$, $u_2$) and ($\tilde{u}_1$, $\tilde{u}_2$) is given by ($y_1$, $y_2$) and ($\tilde{y}_1$, $\tilde{y}_2$). The overall code rate is reduced by puncturing $y_2$ in the stream ($y_1$, $y_2$) and $\tilde{y}_1$ in the stream ($\tilde{y}_1$, $\tilde{y}_2$). In various embodiments a switch selects alternatively the bits $y_1$ and $\tilde{y}_2$ to form the punctured sequence ($y_1$, $\tilde{y}_2$). Finally, a Serial-to-Parallel (S/P) converter performs the conversion of the stream ($y_1$, $\tilde{y}_2$) into the coded bits $v_1$ and $v_2$ corresponding respectively to $y_1$ and $\tilde{y}_2$.

In various embodiments, the TTCM scheme uses a Latin square/rectangular matrix of Random sequence pattern Interleaver (LRI) of size N=2044 bits. The LRI is obtained from an original 47×44=2068 bits LRI pruned to 2044 bits. However, it should be appreciated that the choice of the interleaver size N is totally arbitrary. The particular interleaver size N=2044 has only been chosen to simplify the programming when concatenating the TTCM with the RS. Using any other value of N close to 2044 does not affect the code performance. Furthermore, it is well known that the interleaver size drives both the error correction performance (i.e., the coding gain) and the code latency: they both increase with N. Although increasing the coding gain is always good, the latency may not be increased infinitely. Therefore, by limiting the code latency to a few DMT symbols, the maximum interleaver size of around a few thousands bits may be used. Moreover, the coding gain does not grow linearly with N. For example, the coding gain improvement that may be expected from using N=4000 instead of N=2000 is not as large a the gain between two schemes with N=2000 and N=1000. Therefore, a good compromise between coding gain and latency yields an interleaving table composed of approximately 2000 bits.

The overall TTCM scheme is designed to load all type of b-bits QAM constellations with b integer and varying from 1 to 15 bits (or more). The minimum spectral efficiency supported by the generic scheme is m=2 bits/sec/Hz, requiring to use 4-bits QAM constellations. In an embodiment of the present invention, constellations with b≧4 are employed. In reference to FIG. 3, the codeword v is mapped to a 2-D signal set partitioned into 16 subsets (called cosets) labeled by the four bits ($v_1$, $v_2$, $v_3$, $v_4$) encoded by the rate-2/4 turbo code. The Minimum Square Euclidean Distance (MSED) between points in the same coset is 16 $d_0^2$, where $d_0^2$ is the MSED between points in the un-partitioned constellation. The Coset labels shown in FIG. 3 are obtained by concatenating two ASK signals using a Gray labeling.

Referring now to FIG. 4, as an example, FIG. 4 presents the labeling of the 16-QAM formed by two 4-ASK signals. In this case, each coset is composed of only one point. The bits ($v_1$, $v_2$) are mapped to the y-axis and the bits ($v_3$, $v_4$) are mapped to the x-axis. Using this partitioning simplifies the complexity of the decoder, since the metric calculation can be reduced to the computation of only 1-D distances. For b>4, the labeling of the uncoded bits ($v_5$, $v_6$, ...) is not Gray: we use a labeling as relates to ADSL [2].

FIG. 5 illustrates the procedure for constructing large b-bits constellations recursively, starting from the 8-bits constellation. A 4×4 block is defined with the same MSB labeling as a subset of the 2-D signal set containing all the 16 signals labeled with the same MSBs ($v_{b-2}$, ..., $v_5$) and the 16 possible combinations of the LSBs ($v_4$, $v_3$, $v_2$, $v_1$). As shown in the left part of FIG. 5 and according to the set partitioning presented in FIG. 3, a subset with the same MSB labeling is indeed a 2-D square block of 4×4 labels. The block may be separated in two sub-blocks "n" and "LSB" containing the MSBs and LSBs, respectively. Knowing n and LSB, the original 4×4 block can be easily recovered by combining, for each label, both the LSBs and MSBs in one vector $(v_{b-2}, \ldots, v_1)$, which amounts to computing LSB+16×n. For b that is even and b≧8 or for an odd b and b≧11, a b-bits constellation can be obtained from a (b−2)-bits constellation by replacing each 4×4 block with the same MSB labeling by a 16×16 block with new labels generated from the labels of the original 4×4 block by following the procedure given in FIG. 5.

The recursive pattern applied to higher significant bits "n" is identical to the one used in ADSL, hence the shape of a b-bits constellation is similar to the shape of a G.992.1 (b−4)-bits constellation. In ADSL, the recursive formula for generating larger constellations is valid for b even and b≧4 or for b odd and b≧7, whereas some particular mapping are used for b=2, 3 and 5. Therefore, in the TTCM scheme, for b even, the recursive formula is valid b≧8, i.e., the 256-QAM may be generated from the 64-QAM constellation, and so on. Similarly, for b odd, the recursive formula is valid for b≧11, i.e., the 2048-QAM may be generated respectively from the 512-QAM constellation.

In another embodiment of the present invention, and in reference to FIG. 6, for b=5, the shape of the 32-QAM constellation is inspired by the shape of the G.992.1 8-QAM constellation which is incorporated by reference, the shaping of this constellation has been chosen for keeping an MSED intra-coset equal to 16 $d_0^2$. The performance of the shaping is in comparison with the shaping of the G.992.1 5-bits constellation. Considering that all the constellations are normalized to a unitary energy, the distance between points in the G.992.1 5-bits signal set is obviously larger than in the 32-QAM constellation shown in FIG. 6. However, using the G.992.1 5-bits constellation requires changing the coset partitioning in FIG. 3 by a partitioning with a MSED intra-coset equal to 8 $d_0^2$. An error performance evaluation of the coding scheme with both mappings concluded on the selection of the mapping proposed in FIG. 6.

For b<10, as the constellations cannot be constructed recursively (except for b=8), the constellations are given in FIGS. 4, 6, 7 and 8. In FIGS. 6 to 8, to simplify the diagrams, the constellations are labeled with the MSBs only. For b=6, 8 and 9 (and more), by replacing each 4×4 block with the same MSB labeling by a single label (as shown in FIG. 8), a b-bits constellation is identical to a G.992.1 (b−4)-bits constellation. For example, in FIG. 8, the MSB block labeling of the 9-bits constellation is exactly the same as the labeling of the 5-bits constellation used in the G.992.1 trellis code.

The generic scheme shown in FIG. 1 above, is not applicable for encoding tones with an SNR below 6.81 dB (AWGN noise assumption+no margin), which represents the SNR required to loading m=2 bits/sec/Hz (see table 2). Therefore, the method and system of the present invention proposes in a range of schemes, adapted to the specific spectral efficiencies m=0.5, 1 and 1.5 bits/sec/Hz, permitting loading tones with a SNR up to 8.27 dB lower than the 6.81 dB limitation of the generic scheme. These particular schemes use the same component turbo encoder as the generic TTCM scheme to encode "all" the bits. However, the coded modulation scheme differs and is optimized for each specific value of m. Two cases m=1.5 and m={0.5, 1} are detailed separately below:

For case m=1.5 bits/sec/Hz, as m is not integer, the TTCM scheme uses a 4-D coded modulation. As shown in FIG. 9, the scheme uses the same component turbo encoder (in the dashed box) as the generic scheme discussed in the context of FIG. 1. The rate-1/2 turbo encoder encodes 3 information bits $(u_1, u_2, u_3)$ into 6 bits $(v_1, \ldots, v_6)$ mapped on a 4-D signal set formed by two identical 2-D 8-QAM constellations. The pair of 2-D QAM is then loaded on two distinct tones. The shape of the 8-QAM constellation and the labeling of the 4-D signal set are detailed in FIG. 10.

For case m=0.5 and 1 bit/sec/Hz, as shown in FIG. 11, the encoder used for transmitting 0.5 and 1 bit/sec/Hz is exclusively composed of the rate-1/2 component turbo encoder (dashed box) defined in 2.1.1. The only difference between the two schemes is the constellation mapping used for transmitting $v_1$ and $v_2$:

For 1 bit/sec/Hz, the two encoded bits $v_1$ and $v_2$ are mapped on a 2-D QPSK constellation transmitted over one tone.

For 0.5 bit/sec/Hz, the encoded bit $v_1$ and $v_2$ are mapped on two separate BPSK constellations transmitted over two different tones. Hence, considering 2 dimensions per tone, we use a 4-D BPSK modulation for transmitting 0.5 bit/sec/Hz.

The architecture of the PCCC used in FIG. 11 is identical to the original turbo code proposed by Berrou and Glavieux in C. Berrou, A. Glavieux and P. Thitimajshima, "Near Shannon limit error-correcting coding and decoding: Turbo-codes," in Proc. IEEE ICC, pp. 1064-1070, May 1993, and hence inherit from the particularity of closely approaching the Shannon bound. For a BER of $10^{-7}$, the code operates within 1.55 dB of the Shannon bound.

As in the G.bis standard for ADSL, "ITU-T Recommendation G.992.3 (07/2002)—Asymmetric digital subscriber line transceivers 2 (ADSL2)", the scheme supports b=1 bit constellations (for m=0.5). Thus, by using a 4-D coded modulation transmitting BPSK constellations, it is possible to load a tone with a SNR 3 dB lower than the SNR required for transmitting QPSK constellations. A drawback to this is that the spectral efficiency is divided by a factor two.

The overall TTCM scheme for all m≧0.5 is described as follows: A global scheme summarizing FIGS. 1, 9 and 11 is given in FIG. 12. The bit stream coming from the outer RS code is separated into two streams (uncoded and turbo-coded). For each tone (or pair of tones if m=0.5 or 1.5), the bits to symbol converter forms a symbol v by selecting the bits from each stream according to the tone's spectral efficiency m (which is determined knowing the SNR per tone). The symbol v is mapped to a b-bits constellation, where b depends on m (see table 1.2). The scheme uses the same one/in-one/out redundant bit Turbo-Engine device given in FIG. 13 and that shows up in a dashed box in FIGS. 1, 9 and 11. Therefore, the same encoder-decoder can be used whatever the value of m. The constellation mapping uses either 1 or 2 tones per symbol v, in respect of m. For each value of m, table 1 gives the constellation mapping and the number of tones used to map one symbol v.

TABLE 1.2

| | Constellation Mapping | |
|---|---|---|
| Spectral efficiency (in bits/sec/Hz) | Constellation mapping | # of loaded tones per symbol v |
| 0.5 | BPSK | 2 |
| 1 | QPSK | 1 |
| 1.5 | 8 QAM | 2 |
| m ≧ 2 | $2^{m+2}$ QAM | 1 |

The error performance of the overall coding scheme (outer RS code+inner TTCM) was simulated over an Additive White Gaussian Noised (AWGN) channel for all the possible spectral efficiencies m<6. The simulation parameters are given in Table 1.3. Note that all the simulations consider no outer interleaving between the two codes.

TABLE 1.3

Simulation Parameters

| FEC type | Proposed TTCM + RS |
|---|---|
| Outer code | (255, 239) RS code |
| Outer interleaver | none |
| Inner code | TTCM |
| Inner interleaver | LRI (2044 bits) |
| Inner decoder | MAP (8 iterations) |
| Coded modulation | QAM (1 to 15 bits) |
| Channel model | AWGN |

In order to compare the performance of the proposed TTCM scheme with the current 16 states 4-D trellis code used in ADSL, a TCM coding scheme formed by the concatenation of an outer RS code and an inner 16 states TCM (with no outer interleaving) is simulated.

FIG. 14 presents the BER vs. SNR curves for a TTCM+RS scheme with m equal to 1, 1.5, 2, 3, 4 and 5. Note that the performance curve for m=0.5 may be obtained by shifting the performance curve for m=1 3 dB toward the left. Both the 16 states TCM+RS and the TTCM+RS schemes, the SNR required for transmitting bits with a BER equal to $10^{-7}$ is confined in Table 1.4. According to the Shannon theory, at large SNRs, it is possible transmit one extra bit each time the SNR is doubled (i.e., increased by 3 dB). For m>5, we consider the SNR large enough to applying this rule.

TABLE 1.4

Loading SNR of TCM and TTCM at $10^{-7}$ BER (m < 6)

| Spectral Efficiency (in bits/sec/Hz) | TCM + RS Loading SNR (in dB) | TTCM + RS Loading SNR (in dB) |
|---|---|---|
| 0.5 | — | −1.46 |
| 0.75 | 3.70 | — |
| 1 | — | 1.55 |
| 1.5 | 6.71 | 4.67 |
| 2 | — | 6.81 |
| 2.5 | 11.69 | — |
| 3 | — | 11.27 |
| 3.5 | 14.50 | — |
| 4 | — | 14.03 |
| 4.5 | 17.88 | — |
| 5 | — | 17.22 |
| 5.5 | 21.14 | — |

As for the coding gain, and as shown in Table 1.4, the TCM and TTCM schemes do not offer the possibility of transmitting the same spectral efficiency (except for m=1.5). Therefore, the net coding gain between the two schemes cannot be obtained straightforwardly. However, the TCM scheme can support integer spectral efficiencies when using a 4-D constellation formed by a pair of 2-D b-bits and (b+1)-bits constellations. As an example, FIG. 15 shows the simulated bit error performance of four different coding schemes for m=5 bits/sec/Hz spectral efficiency. The following legend is used to interpret the results displayed in the Figure.

1. Uncoded 32-QAM modulation (dashed);
2. Standard 16 states trellis code (solid);
3. Standard 16 states trellis code concatenated with an outer (255,239) RS code (solid+triangles); and
4. Turbo trellis code concatenated with an outer (255,239) RS code (solid+diamonds).

According to FIG. 15, at the BER of $10^{-7}$, the net coding gain of the TTCM+RS scheme compared to the uncoded 32-QAM is 7.1 dB, which, is 2.6 dB of coding gain relative to the TCM+RS scheme.

Another aspect of the invention concerns the rate improvements. The sections above dealing with error performance and coding gain compare the performance of the TCM and the TTCM over an AWGN channel. This comparison provides a good estimate of the average net coding gain, which can help in the calculation of the maximum rate improvement achievable by using a TTCM instead of the current TCM. In various embodiments, the average net coding gain of the TTCM scheme is 7.1 dB, i.e., 2.6 dB coding gain relative to the current TCM16+RS code, which corresponds to the possibility of loading an extra 0.8 information bit per tone.

However, considering that every tone may be increased by 0.8 bit is too rough an approximation. Indeed, the current maximum number of coded bits that may be loaded per tone is limited (15 bits in ADSL). Therefore, when the SNR per tone is far larger than the SNR required for loading the largest constellation, which occurs at low frequencies, some tones may not benefit from the 0.8 bit expansion as the size of the constellation used without TTCM is already saturated. Conversely, for small spectral efficiencies, the coding gain of the TTCM relative to the TCM is larger than 2.6 dB, hence some tones with a low SNR may benefit from more than 0.8 bit expansion.

In this section, in order to get a more realistic estimate of the rate of improvement that may be obtained by switching from the TCM to the TTCM coding scheme, one embodiment of the current invention computes the bit loading (i.e., the rate performance) of both schemes over a DMT channel loading different size constellations according to the SNR per tone. In all simulations, we consider a 6 dB SNR margin. We analyze two examples considering a specific VDSL transmission over 3 and 6 kft loops (FIGS. 17 and 18). The VDSL2 transmission uses frequency range up to 30 MHz, however, the way of loading the bandwidth is still not surely defined for frequencies above 12 MHz. Below 12 MHz the bandwidth partition is similar to VDSL. Therefore, the experimental results focused on the performance of the code using VDSL transmission up to 12 MHz. Downstream transmission was studied against exchange SBC requirements LB-023. SBC, "VDSL2 Service Provider Requirements", Leuven, Belgium, Jun. 14, 2004, LB-097R2. Ad Hoc Convenor, "G.vdsl2: Add-hoc session report", Leuven, Belgium, Jun. 17, 2004, and T1.PP.424-2004, "Interface between Networks and Customer Installation Very-high-bit-rate Digital Subscriber Lines (VDSL) Metallic Interface (DMT-based)", i.e., using the ceiling mask with a total power of 14.5 dBm given in FIG. 16. In this case, the total bandwidth is divided into 2784 tones, with each tone 4.3125 kHz wide. 1438 tones are loaded for downstream, which results in a maximum rate improvement of 0.8×1438×4=4.6 Mbits/sec. FIGS. 17 and 18 show the SNR and the bit loading of a 3K foot loop and a 6K foot loop under exemplary source provider specifications, e.g., SBC (WLEC) defined conditions using the ceiling mask given in FIG. 16. According to Table 1.5, the rate improvement between TTCM and TCM reaches 3.4 Mbits/sec at 3 kft. At 6 kft the rate improvement is 1 Mbits/sec, which corresponds to 38% of rate improvement relative to the TCM.

TABLE 1.5

| Bit Rates of 3K and 6K foot loops under SBC Conditions | | |
|---|---|---|
| Loop Length | TCM + RS | TTCM + RS |
| 3 kft | 16.6 Mbits/sec | 20 Mbits/sec |
| 6 kft | 2.6 Mbits/sec | 3.6 Mbits/sec |

As far as the rate vs. reach performance is concerned, FIG. 19 shows the rate versus reach performance obtained by transmitting a VDSL signal using the ceiling mask given in FIG. 16 over an AWGN channel. The performance is given for a loop length varying from 1 to 2.75 km. At a given rate, through the various embodiments of the invention, a gain of approximately 100 meters of reach for loops longer than 2.5 km was realized.

As far as latency is concerned, Table 1.6 below represents the latency of the TTCM scheme transmitting a downstream signal, with the ceiling mask given in FIG. 16, over an AWGN channel. The inner interleaver size remained at 2044 bits. For loops shorter than 1 km, more than 1022 tones are loaded. In this case, as each tone can load up to 2 bits coded by the turbo component encoder, a turbo-coded block is contained in 1 DMT symbol, i.e., the latency is reduced to 0.5 ms.

TABLE 1.6

| Latency of VDSL D/S with Ceiling Mask over AWGN Channel | | |
|---|---|---|
| Loop length | # of loaded symbols | Latency |
| <1 km | 1 | 0.5 ms |
| from 1 to 2 km | 2 | 1 ms |
| >2.5 km | 3 or more | >1.5 ms |

Therefore, in at least one embodiment of the present invention, a unifying TTCM scheme for VDSL2 that is based on the most efficient items of TTCM previous proposals, such as, Catena Networks, Inc, "G.gen.bis: A Turbo TCM scheme with low decoding complexity," ITU standard contribution, Study Group 15 Question 4/15, BI-090, Bangalore, India, October 2000, Vocal Technologies Ltd, ITU standard contribution, Study Group 15 Question 4/15, Documents BA-020R1 and HC-073, 2000, and Mitsubishi Electric Co, "G.gen: Proposal for inner-interleaver of TTCM (PCCC)," ITU standard contribution, Study Group 15 Question 4/15, BA-088R1, Antwerp, Belgium, June 2000 for ADSL and ADSL2 is introduced and evaluated. The present TTCM encodes 2 bits per tone as in the Catena reference to limit the complexity. Various embodiments of the invention also make use of an LRI interleaver, e.g. as suggested by the Mitsubishi and Vocal references. Since the previous TTCM contributions did not clearly address odd constellations, various embodiments of the current invention propose efficient 3, 5, 7 and 9 bits constellation architectures for TTCM. Moreover, various embodiment of the current invention propose for both even and odd higher constellations (supporting more than 8 bits) a recursive construction algorithm related to the ADSL paradigm. Various embodiments also present a way to benefit from as much loadable bandwidth as possible by supporting 0.5 bit/sec/Hz of spectral efficiency at signal to noise ratios close to the Shannon bound.

In the presence of the (255,239) outer Reed Solomon code but without outer interleaver (fast mode), the present TTCM scheme according to various embodiments of the invention has been demonstrated to provide 7.1 dB of average net coding gain, i.e., 2.6 dB of coding gain improvement relative to the standard 16 states 4-D trellis code used in current ADSL2 systems, International Telecommunication Union (ITU), "Draft new recommendation G.992.1: Asymmetrical digital subscriber line (ADSL) transceivers", July 1999. This substantial coding gain leads to increase VDSL2 rate by 38% at 6 kft against SBC conditions with ~1.5 ms of latency, LB-023. SBC, "VDSL2 Service Provider Requirements", Leuven, Belgium, Jun. 14, 2004, LB-097R2. Ad Hoc Convenor, "G.vdsl2: Add-hoc session report", Leuven, Belgium, Jun. 17, 2004, and T1.PP.424-2004, "Interface between Networks and Customer Installation Very-high-bit-rate Digital Subscriber Lines (VDSL) Metallic Interface (DMT-based)".

The embodiments of the present inventions are not to be limited in scope by the specific embodiments described herein. For example, although many of the embodiments disclosed herein have been described with reference to systems and methods for performing turbo trellis coded modulation (TTCM) in xDSL transceivers, the principles herein are equally applicable to other aspects of signal processing. Indeed, various modifications of the embodiments of the present inventions, in addition to those described herein, will be apparent to those of ordinary skill in the art from the foregoing description and accompanying drawings. Thus, such modifications are intended to fall within the scope of the following appended claims. Further, although some of the embodiments of the present invention have been described herein in the context of a particular implementation in a particular environment for a particular purpose, those of ordinary skill in the art will recognize that its usefulness is not limited thereto and that the embodiments of the present inventions can be beneficially implemented in any number of environments for any number of purposes. Accordingly, the claims set forth below should be construed in view of the full breath and spirit of the embodiments of the present inventions as disclosed herein.

The invention claimed is:

1. A method of performing turbo trellis coded modulation (TTCM) on an n bit information word in a discrete multitone (DMT) system comprising:

passing at least one least significant bit of the n bit information word into a redundant bit turbo-engine to generate an m bit code word, wherein passing the at least one information bits into the redundant bit turbo-engine comprises splitting the at least one least significant bit into duplicate first and second serial data streams, passing the first serial data stream through a first systematic recursive encoder and passing the second serial data stream through a second systematic recursive encoder preceded by an interleaver;

alternately selecting bits output from the first and second systematic recursive encoders to form an m-bit serial data stream;

converting the m-bit serial data stream into the m-bit code word through serial to parallel conversion;

appending the m-bit code word to the n bit information word at the least significant bit position to create an (n+m) bit codeword v; and preparing the codeword v for transmission over a communications channel, wherein the (n+m) bit code is mapped onto two identical 2 dimensional 8-QAM constellation mappings.

2. The method according to claim 1, wherein n is also the spectral efficiency of the turbo trellis coded modulation.

3. The method according to claim 2, wherein n.gtoreq.2.

4. The method according to claim 3, wherein 2 least significant bits are passed to the redundant bit turbo-engine to generate a 2 bit code word and the 2 bit codeword is appended to the least significant bit position of the n bit information word to create a 2+n bit codeword v.

5. The method according to claim 4, wherein preparing the codeword v for transmission over a communications channel comprises mapping the codeword v onto a 2 dimensional $2^{n+2}$ points QAM constellation.

6. The method according to claim 1, wherein the interleaver is a Latin square/rectangular matrix of random sequence pattern interleaver (LRI) with a size=2044 bits.

7. The method according to claim 5, wherein the constellation mapping comprises mapping to at least a 4 bits QAM constellation.

8. The method according to claim 5, wherein mapping the codeword v onto a 2 dimensional $2^{n+2}$ points QAM constellation comprises mapping the codeword v to a 2 dimensional signal set partitioned into 16 cosets labeled by the four least significant bits of the codeword v.

9. The method according to claim 7, wherein a minimum squared Euclidian distance (MSED) between points in the same coset is 16 $d_0^2$, where 16$d_0^2$ is the MSED between point in the unpartitioned constellation.

10. The method according to claim 8, wherein the constellation is a b=4 bits QAM (16 QAM) constellation and each coset is formed by a single constellation point.

11. The method according to claim 8, wherein the constellation is a b>4 bits QAM constellation, each coset is formed by $2^{b-4}$ points and is determined by the turbo coded bits only, and the coset labels are obtained from a square lattice with MSED $d_0^2$ between points that is constructed by duplication a 4.times.4 pattern obtained when the constellation is a 4 bits QAM such that the MSED between points with the same label remains equal to 16 $d_0^2$.

12. The method according to claim 2, wherein n=1.5.

13. The method according to claim 12, wherein 3 least significant bits are passed to the redundant bit turbo-engine to generate a 3 bit code word and the 3 bit codeword is appended to the least significant bit position of the 3 bit information word to create a 6 bit codeword.

14. The method according to claim 13, wherein preparing the (n+m) bit code word for transmission over a communications channel comprises mapping the (n+m) bit codeword onto two identical 2 dimensional 8-QAM constellations and loading the two 2 dimensional 8-QAM constellations onto two distinct tones such that the 8 constellation map points 000, 100, 110, 010, 011, 111, 101 and 001 are at x-y locations {2,1}, {1,2}, {-1,2}, {-2,1}, {-2,-1}, {-1,-2}, {1,-2} and {2,-1} respectively.

15. The method according to claim 2, wherein n equals either 1 or ½.

16. The method according to claim 15, wherein the one least significant bit is passed to the redundant bit turbo-engine to generate a 1 bit code word and the 1 bit codeword is appended to the least significant bit position of the 1 bit information word to create a 2 bit codeword.

17. The method according to claim 16, wherein preparing the (n+m) bit code word for transmission over a communications channel comprises, if n=½, performing a 4 dimensional (two 2-D) mapping of the (n+m) bit codeword onto two separate BPSK constellations on two distinct tones, otherwise, if n=1, performing a 2 dimensional mapping of the (n+m) bit codeword onto a 2 dimensional QPSK constellation on a single tone.

18. A redundant bit turbo engine apparatus for performing turbo trellis coded modulation (TTCM) on an n bit information word in a DMT system comprising:

first and second serial data paths that each receive a duplicate serial data stream comprised of at least one least significant bit of then bit information word;

a serial to parallel converter for converting the m-bit serial data stream into an m-bit code word;

circuitry adapted to append the m-bit code word to the n bit information word at the least significant bit position to create an (n+m) bit codeword; and a constellation mapper for mapping the (n+m) bit codeword on to at least one tone to prepare the (n+m) bit code word for transmission over a communications channel wherein the first serial data path comprises a first systematic recursive encoder, and the second serial data path comprises a second systematic recursive encoder preceded by an interleaver, and a switch adapted to alternately select bits output from the first and second serial data paths to form an m-bit serial data stream, wherein the constellation mapper is adapted to map the (n+m) bit code onto two identical 2 dimensional 8-QAM constellation mappings.

19. The apparatus according to claim 18, wherein n is also the spectral efficiency of the turbo trellis coded modulation.

20. The apparatus according to claim 19, wherein n≧2.

21. The apparatus according to claim 20, wherein the first and second serial data paths are adapted to receive a duplicate serial data stream comprised of 2 least significant bits of the n bit information word.

22. The apparatus according to claim 21, wherein the constellation mapper is adapted to map the (n+m) bit code word onto a 2 dimensional $2^{n+2}$ points QAM constellation on a single tone.

23. The apparatus according to claim 18, wherein the interleaver is a Latin square/rectangular matrix of random sequence pattern interleaver (LRI) with a size=2044 bits.

24. The apparatus according to claim 19, wherein n=1.5.

25. The apparatus according to claim 24, wherein the first and second serial data paths are adapted to receive a duplicate serial data stream comprised of 3 least significant bits of the n bit information word and to each generate a 3 bit serialized code word.

26. The apparatus according to claim 24, wherein the constellation mapper is adapted to load the two pairs of 2 dimensional 8-QAM constellations onto two distinct tones.

27. The apparatus according to claim 19, wherein n equals either 1 or ½.

28. The apparatus according to claim 27, wherein the first and second serial data paths are adapted to receive a duplicate serial data stream comprised of one least significant bit and to each generate a 1 bit code word.

29. The apparatus according to claim 19, wherein the constellation mapper is adapted to perform a 4 dimensional (two 2-D) mapping of the (n+m) bit codeword onto two separate BPSK constellations on two distinct tones if n=½, and to perform a 2 dimensional mapping of the (n+m) bit codeword onto a 2 dimensional QPSK constellation on a single tone if n=1.

* * * * *